US012800651B2

(12) United States Patent
Rayzman

(10) Patent No.: US 12,800,651 B2
(45) Date of Patent: Nov. 17, 2026

(54) SEMICONDUCTOR PACKAGE WITH TESTING PADDLE HAVING ENLARGED LANDS FOR PROBE ACCESS DURING DEVICE CHARACTERIZATION

(71) Applicant: Sandisk Technologies, Inc., Milpitas, CA (US)

(72) Inventor: Lenny Rayzman, San Jose, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 502 days.

(21) Appl. No.: 18/362,140

(22) Filed: Jul. 31, 2023

(65) Prior Publication Data

US 2024/0426904 A1 Dec. 26, 2024

Related U.S. Application Data

(60) Provisional application No. 63/509,203, filed on Jun. 20, 2023.

(51) Int. Cl.
*G01R 31/28* (2006.01)

(52) U.S. Cl.
CPC ................................ *G01R 31/2886* (2013.01)

(58) Field of Classification Search
CPC .................................................. G01R 31/2886
USPC .................................................... 324/754.03
See application file for complete search history.

(56) References Cited

U.S. PATENT DOCUMENTS

| | | | | |
|---|---|---|---|---|
| 2002/0004339 | A1* | 1/2002 | Hussain | G01R 1/0483 439/625 |
| 2004/0207387 | A1* | 10/2004 | Chung | G01R 31/2893 324/750.01 |
| 2013/0147505 | A1* | 6/2013 | Wang | G01R 1/07342 324/755.01 |
| 2017/0323834 | A1* | 11/2017 | Ziglioli | H10P 74/273 |
| 2018/0299490 | A1* | 10/2018 | Kim | G01R 1/07357 |
| 2022/0011361 | A1* | 1/2022 | Campbell | G01R 31/2801 |
| 2023/0067209 | A1* | 3/2023 | Chen | G01R 1/0433 |
| 2024/0128134 | A1* | 4/2024 | Miwa | H10P 74/273 |

* cited by examiner

*Primary Examiner* — Raul J Rios Russo
(74) *Attorney, Agent, or Firm* — Dentons Durham Jones Pinegar P.C.

(57) ABSTRACT

A testing paddle for a semiconductor package includes a land that is electrically and/or communicatively coupled to a test point of a device under test (DUT) die. The land is associated with a spacing characteristic that is larger than a spacing characteristic associated with the test point. As such, during a characterization process, a probe can more easily access the land of the testing paddle when compared with current solutions in which the probe is required to contact the test point of the DUT die.

20 Claims, 3 Drawing Sheets

SEMICONDUCTOR PACKAGE WITH TESTING PADDLE HAVING ENLARGED LANDS FOR PROBE ACCESS DURING DEVICE CHARACTERIZATION

CROSS-REFERENCE TO RELATED APPLICATIONS

The present application claims priority to U.S. Provisional Application 63/509,203 entitled "TESTING PADDLE FOR SEMICONDUCTOR DEVICE CHARACTERIZATION", filed Jun. 20, 2023, the entire disclosure of which is hereby incorporated by reference in its entirety.

BACKGROUND

To test or probe a semiconductor device or package, a lid of the semiconductor package is omitted or removed to expose an internal semiconductor die of the semiconductor package. When the semiconductor die is exposed, the semiconductor package may undergo a characterization process in which the behavior and the performance of the semiconductor package are tested and analyzed.

During the characterization process, a probe (e.g., an oscilloscope, a vector network analyzer (VNA)) contacts one or more die pads or test points on the exposed semiconductor die to take various measurements (e.g., voltage levels, device timing, signal integrity). However, it is difficult to take accurate measurements with the probe due to the size of the one or more die pads or test points and/or due to a pitch between the various die pads or test points.

Accordingly, it would be beneficial for a semiconductor package to include features that enable a probe to easily access various test points of the semiconductor package during a characterization process.

SUMMARY

The present application describes a testing paddle for a semiconductor package. The testing paddle may be formed from a substrate or a printed circuit board (PCB). In an example, the testing paddle is provided on a top surface of a device under test (DUT) die of the semiconductor package. The testing paddle includes one or more lands that are electrically coupled to corresponding test points of the DUT die. The one or more lands may have larger dimensions and/or a larger pitch when compared to the dimensions and/or the pitch of the one or more test points of the DUT die. As such, a probe can more easily access the one or more lands of the testing paddle during a characterization process when compared with current solutions in which a probe contacts the one or more test points of the DUT die.

Accordingly, an example of the present disclosure describes a semiconductor package that includes a device under test (DUT) die and a test point associated with the DUT die. In an example, the test point is electrically coupled to a trace of the semiconductor package and is associated with a first spacing characteristic. A testing paddle is associated with the DUT die. A land is provided on a surface of the testing paddle. In an example, the land is electrically coupled to the test point and is associated with a second spacing characteristic that is larger than the first spacing characteristic.

In another example, a semiconductor package is described. The semiconductor package includes a carrier board and a semiconductor die mounted on, and electrically coupled to, the carrier board. The semiconductor package may also include a testing paddle. In an example, the testing paddle includes at least one land that is electrically coupled to the semiconductor die.

In yet another example, the present application describes a semiconductor package that may be used for device characterization. In an example, the semiconductor package includes a device under test (DUT) die and a testing means associated with the DUT die. In an example, the testing means is electrically coupled to a communication means of the semiconductor package and is also associated with a first spacing characteristic. A testing surface means is coupled to the DUT die. In an example, the testing surface means includes a connection means that is electrically coupled to the testing means. The connection means has a second spacing characteristic that is greater than the first spacing characteristic.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

To test or probe a semiconductor device or package, a lid of the semiconductor package is omitted or removed to expose an internal semiconductor die of the semiconductor package. When the semiconductor die is exposed, the semiconductor package may undergo a characterization process in which the behavior and the performance of the semiconductor package are tested and analyzed.

For example, an oscilloscope, a vector network analyzer (VNA), or another probe is provided within the opening of the semiconductor package and contacts one or more die pads or test points on the exposed semiconductor die. However, the size of the die pads or test points is relatively small when compared with a size of a testing tip of the probe (or with a size of the probe itself). Additionally, as semiconductor packages get smaller, a pitch, or the spacing, between the various die pads or test points gets tighter. As such, it is difficult to accurately place the probe and/or make a reliable contact with the various die pads or test points.

To address the above, the present application describes a testing paddle for a semiconductor package. In an example, the semiconductor package is an open lid semiconductor package. However, the testing paddle may be used with any semiconductor package.

The testing paddle may be provided on a top surface of a device under test (DUT) die of the semiconductor package. The testing paddle includes one or more lands that are electrically coupled to corresponding test points of the DUT die. In an example, the one or more lands have larger dimensions, different shapes and/or a larger pitch when compared to the dimensions, the shape and/or the pitch of the one or more test points of the DUT die. As such, a probe can more easily contact or access the one or more lands of the testing paddle during a characterization process when compared with current solutions.

Accordingly, many technical benefits may be realized including, but not limited to, enabling one or more probes to physically access various test points associated with a semiconductor package; enabling the placement of multiple probes within the same semiconductor package; and providing larger contact areas and/or a greater space between contact areas which helps ensure that the probe is positioned to take accurate measurements.

These and other examples will be shown and described in greater detail with respect to FIG. 1-FIG. 4.

Figure 1:
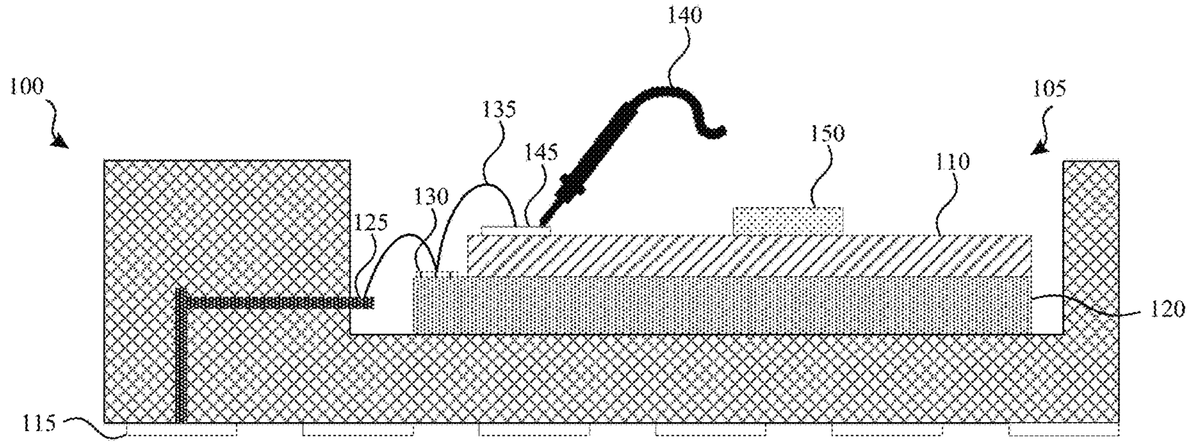
FIG. 1 illustrates a semiconductor package having a testing paddle according to an example.

FIG. 1 illustrates a semiconductor package 100 having a testing paddle 110 according to an example. In an example, the semiconductor package 100 is a semiconductor package that may be used for a characterization process. As such, the semiconductor package 100 includes a device under test (DUT) die 120. In an example, the DUT die 120 is a NAND die or a stack of NAND dies. In another example, the DUT die 120 is a semiconductor die, a stack of semiconductor dies, an integrated circuit and/or a stack of integrated circuits.

The semiconductor package 100 may also be an open-lid or open-cavity semiconductor package. As such, the semiconductor package 100 may include or otherwise define an opening or a cavity 105 that exposes the DUT die 120. In another example, the semiconductor package 100 may be any type of semiconductor package-lidded or otherwise. In an example, the semiconductor package 100 also includes one or more contacts 115. The contacts 115 may be used to electrically and/or communicatively couple the semiconductor package 100 to a carrier board or a printed circuit board (PCB).

A trace 125 may also be provided in, or otherwise associated with, the semiconductor package 100. The trace 125 may be electrically and/or communicatively coupled to one or more of the contacts 115. Although one trace 125 is shown, the semiconductor package 100 may include multiple traces.

In an example, the DUT die 120 includes a test point 130. The test point 130 may be a pad (e.g., a bond pad or a die pad), a node, an input/output pin, a signal trace and so on. The test point 130 may have a first set of dimensions and/or a first shape. The test point 130 may also have, or otherwise be associated with, a first spacing characteristic. For example, the DUT die 120 may include multiple test points 130 and a pitch may separate, or otherwise be associated with, each test point 130. In another example, a pitch may separate a test point 130 from another component (e.g., a pin, a node) of the DUT die 120.

The test point 130 may be electrically and/or communicatively coupled to the trace 125. In the example shown in FIG. 1, a bond wire 135 electrically and/or communicatively couples the test point 130 to the trace 125. Although a bond wire 135 is specifically mentioned, the test point 130 and the trace 125 may be electrically and/or communicatively coupled using another conductive material or another connection/communication mechanism.

As previously indicated, semiconductor devices are becoming increasingly miniaturized. As such, the various components (e.g., the pads, the nodes, the input/output pins, the signal traces) are becoming smaller and smaller and are more tightly packed (e.g., there is a smaller/tighter pitch between the components). Accordingly, it may be difficult for a probe 140 to reach and/or make a reliable contact with the test point 130.

To address this, and as previously indicated, the semiconductor package 100 includes a testing paddle 110. The testing paddle 110 is associated with the DUT die 120. In an example, the testing paddle 110 is coupled to the DUT die 120. For example, the testing paddle 110 may be positioned on a top surface of the DUT die 120. Although the testing paddle 110 is shown and described as being positioned on the top surface of the DUT die 120, the testing paddle 110 may be provided anywhere within the cavity 105 (or outside of the cavity 105) of the semiconductor package 100.

The testing paddle 110 may be formed from a substrate or a PCB. The testing paddle 110 also includes a land 145. The land 145 may be positioned or otherwise provided on a top surface of the testing paddle 110. In an example, the land 145 is communicatively and/or electrically coupled to the test point 130. For example, the land 145 and the test point 130 are electrically and/or communicatively coupled using a bond wire 135. Although a bond wire 135 is specifically shown and described, the land 145 and the test point 130 may be electrically and/or communicatively coupled using another conductive material or another connection/communication mechanism. For example, microbumps may be used to connect the testing paddle 110 to the DUT die 120. In another example, traces and vias may be used to interconnect the testing paddle 110 and the DUT die 120.

In an example, the land 145 is formed from a conductive material. For example, the land 145 may be formed from gold, silver, copper, nickel or a combination of conductive materials.

In addition, the land 145 may have a set of dimensions that are larger or greater than the set of dimensions of the test point 130. For example, the test point 130 may have a first set of dimensions and the land 145 may have a second set of dimensions that are larger, or greater than, the first set of dimensions. In another example, the land 145 may have a shape that is different than the shape of the test point 130. For example, the test point 130 may have a first shape and the land 145 may have a second, different shape. Additionally, the land 145 may have or otherwise be associated with a second spacing characteristic that is different from, or greater than, the first spacing characteristic associated with the test point 130.

In an example, the testing paddle 110 may have multiple lands 145. When multiple lands 145 are included on the testing paddle 110, a pitch between one or more of the lands 145 may be greater than the pitch between one or more of the test points 130. For example, a pitch between the test points 130 may be 80 micrometers (μm) whereas a pitch between the lands 145 may be 0.25 millimeters (mm) or more.

In an example, each land 145 may have the same set of dimensions or a different set of dimensions. Additionally, the pitch between the lands 145 may be based, at least in part, on the set of dimensions. In another example, each land 145 may be formed from the same conductive material or from different conductive materials. In an example, the dimensions, the pitch and/or the materials that form a particular land 145 may be based, at least in part, on a type of probe 140 that will contact the particular land 145, on a type of measurement that will be taken from the particular land 145 and/or on a type of test point 130 to which the particular land 145 is connected.

The lands 145 may also be arranged in different patterns or arrangements. For example, the lands 145 could be staggered into two or more rows. In another example, the lands 145 may be arranged diagonally or around an outer edge of the testing paddle 110. Although specific arrangements are mentioned, other arrangements/patterns are possible.

The testing paddle 110 may also include a passive component 150. The passive component 150 may be coupled to a top surface of the testing paddle 110 and/or coupled to the land 145. In an example, the passive component 150 is a termination resistor that terminates and/or matches an impedance of a signal between the test point 130 and the land 145.

Figure 2:
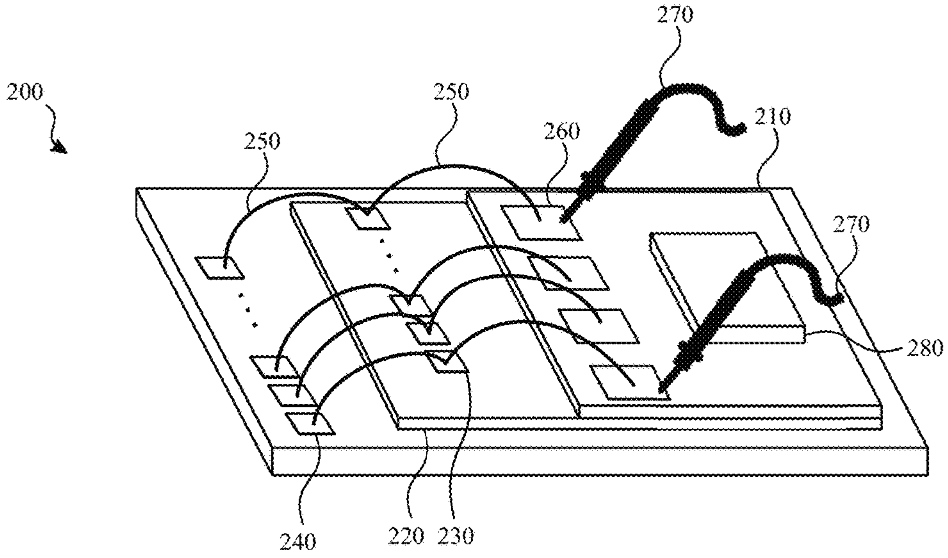
FIG. 2 illustrates a perspective view of a semiconductor package having a testing paddle according to an example.

FIG. 2 illustrates a perspective view of a semiconductor package 200 having a testing paddle 210 according to an example. In an example, the semiconductor package 200 and the testing paddle 210 may be similar to the semiconductor package 100 and the testing paddle 110 shown and described with respect to FIG. 1.

For example, the semiconductor package 200 may include a device under test (DUT) die 220 having multiple test points 230. In an example, each test point 230 has a set of dimensions. Additionally, a first pitch may be associated with, or otherwise separate, each of the test points 230.

The DUT die 220 may also be communicatively coupled to the semiconductor package 200. For example, each test point 230 may be communicatively and/or electrically coupled to one or more connection points 240 associated with the semiconductor package 200. In an example, a bond wire 250 electrically and/or communicatively couples a particular connection point 240 to a particular test point 230.

As previously described, the semiconductor package 200 also includes a testing paddle 210. The testing paddle 210 includes one or more lands 260. In an example, each of the one or more lands 260 may be electrically coupled to a respective test point 230 using a bond wire 250. In the example shown in FIG. 2, each of the one or more lands 260 has a set of dimensions that are larger than the set of dimensions of the one or more test points 230. Additionally, in this example, the pitch between two or more of the lands 260 is greater than the pitch between two or more of the test points 230. In another example, a shape of one or more of the lands 260 may be different than the shape of the test points 230.

In an example, the pitch between the lands 260 may be based, at least in part, on the dimensions of the lands 260. In another example, the lands 260 and the test points 230 may have the same or similar dimensions and/or shapes, but a larger pitch may separate the lands 260 when compared to the pitch that separates the test points 230. In another example, different pitches may separate different lands 260. The different pitches may be based, at least in part, on a set of dimensions associated with the lands 260, a type of probe 270 that will contact the lands 260, a type of test point 230 to which the land 260 is connected, and so on.

Accordingly, a probe 270 may more easily access one or more of the lands 260 when compared with an ease of access to the test point 230 to which the land 260 is coupled. In an example, the size and/or the spacing of each of the lands 260 may enable two or more probes 270 to concurrently contact a respective land 260. In another example, two or more probes 270 may concurrently contact different lands 260 of the testing paddle 210.

In an example, the testing paddle 210 also includes a passive component 280. The passive component 280 may be coupled to the testing paddle 210 and/or one or more of the lands 260.

Figure 3:
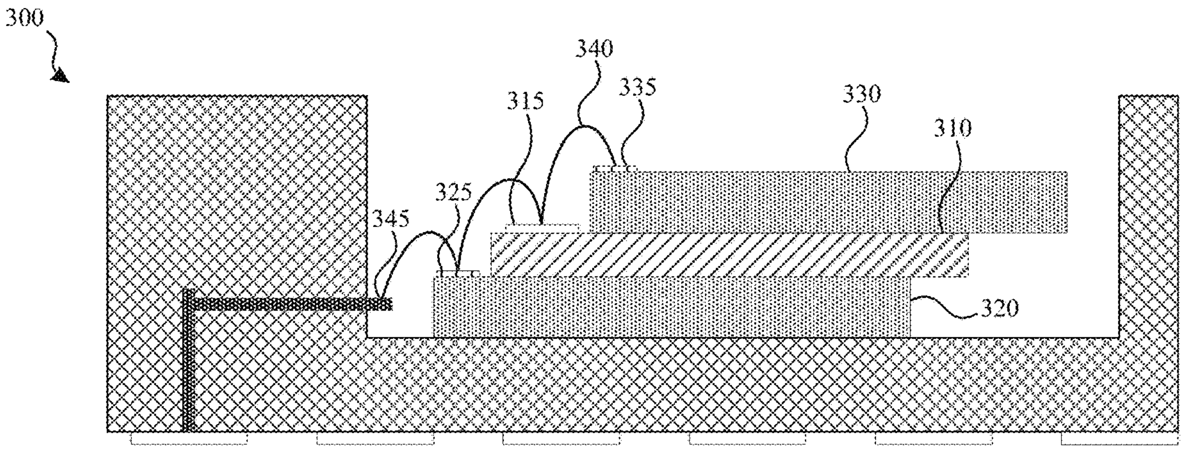
FIG. 3 illustrates a semiconductor package having multiple device under test (DUT) dies and a testing paddle according to an example.

FIG. 3 illustrates a semiconductor package 300 having multiple device under test (DUT) dies and a testing paddle 310 according to an example. For example, the semiconductor package 300 includes a first DUT die 320 and a second DUT die 330.

Although the semiconductor package 300 includes multiple DUT dies, the semiconductor package 300, each of the DUT dies, and the testing paddle 310 may be similar to the semiconductor package 100, the DUT die 120 and/or the testing paddle 110 shown and described with respect to FIG. 1.

For example, the first DUT die 320 includes a first test point 325. Likewise, the second DUT die 330 includes a second test point 335. Each of the first test point 325 and the second test point 335 may have a shape, a set of dimensions and/or be associated with a pitch such as previously described.

Additionally, each of the first test point 325 and the second test point 335 are electrically and/or communicatively coupled to a land 315 associated with the testing paddle 310. For example, a bond wire 340 may communicatively couple the first test point 325, the second test point 335 and the land 315. The bond wire 340 may also electrically and/or communicatively couple the first test point 325 to a trace 345 or other connection point of the semiconductor package 300.

In an example, the land 315 has a set of dimensions that are larger than the set of dimensions of the first test point 325 and the second test point 335. In another example, the land 315 has a shape that is different than the shape of the first test point 325 and/or the second test point 335. In yet another example, a spacing characteristic, or a pitch, associated with the land 315 may be larger or greater than a spacing characteristic, or the pitch, associated with the first test point 325 and/or the second test point 335.

Although FIG. 3 shows the testing paddle 310 provided between the first DUT die 320 and the second DUT die 330, the testing paddle 310 may be provided on a top surface of the second DUT die 330. In another example, the testing paddle 310 may be provided on a bottom surface (or underneath) the first DUT die 320. In yet another example, the semiconductor package 300 may include multiple different testing paddles 310 and each testing paddle may include one or more lands 315.

Figure 4:
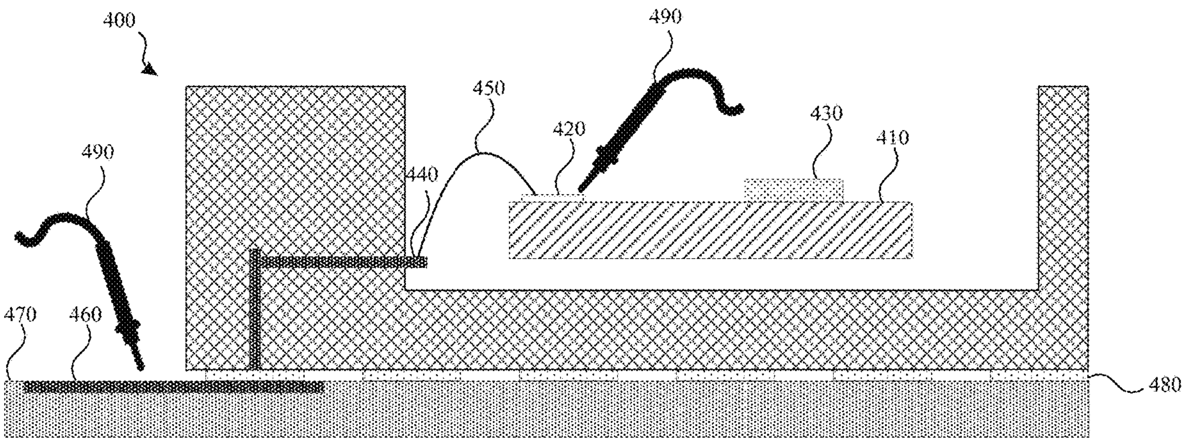
FIG. 4 illustrates a semiconductor package having a testing paddle according to another example.

FIG. 4 illustrates a semiconductor package 400 having a testing paddle 410 according to another example. As with the other examples described herein, the semiconductor package 400 and the testing paddle 410 may be similar to the semiconductor package 100 and the testing paddle 110 shown and described with respect to FIG. 1.

For example, the testing paddle 410 may include a land 420 and a passive component 430. In this example, the land 420 is electrically and/or communicatively coupled (e.g., using a bond wire 450) to a trace 440 (or other connection point) of the semiconductor package 400. Although a device under test (DUT) die is not shown, a DUT die may be included.

The semiconductor package 400 may also be coupled to a carrier board 470 or a PCB. In an example, the semiconductor package 400 is electrically and/or communicatively coupled to the carrier board 470. For example, one or more contacts 480 of the semiconductor package 400 may be electrically and/or communicatively coupled to a measurement point 460 (e.g., a trace, a pad) of the carrier board 470.

In this example, the testing paddle 410 may be used to evaluate or test various properties of the semiconductor package 400 itself. For example, a first probe 490 may be provided on the trace (or connection point/connection pad) on the carrier board 470 while a second probe 490 contacts the land 420. The probes 490 may then be used to measure various properties or characteristics of the semiconductor package 400 including, but not limited to, through-package network characteristics, mechanical properties of the semiconductor package 400, electrical properties of the semiconductor package 400 and/or thermal properties of the semiconductor package 400.

In another example, the testing paddle 410 and/or the probes 490 may be arranged to enable the probes 490 to test various sections or subsections of the semiconductor package 400. In yet another example, de-embedding may be used to remove (e.g., mathematically remove) sections of the measurement point 460 (e.g., the reference plane may be moved). In this example, de-embedding could be applied to a small section of a trace which would move the reference plane such that a measurement is taken between one or more of the contacts 480 and the probe 490 on the testing paddle 410. In another example, any section of the testing paddle 410 (e.g., the land 420) could also be removed using a similar process. For example, a path may be established from one or more of the contacts, through the bond wire 450 and up to, but not including, the land 420.

Accordingly, examples of the present disclosure describe a semiconductor package, comprising: a device under test (DUT) die; a test point associated with the DUT die, the test point electrically coupled to a trace of the semiconductor package and associated with a first spacing characteristic; a testing paddle associated with the DUT die; and a land provided on a surface of the testing paddle, wherein the land is electrically coupled to the test point and associated with a second spacing characteristic that is larger than the first spacing characteristic. In an example, the first spacing characteristic is a first pitch between the test point and another test point associated with the DUT die and the second spacing characteristic is a second pitch between the land and another land provided on the surface of the testing paddle. In an example, the second spacing characteristic is based, at least in part, on one or more dimensions of the land. In an example, the DUT die is a first DUT die and the semiconductor package further comprises a second DUT die, wherein the testing paddle is provided between the first DUT die and the second DUT die. In an example, the test point associated with the first DUT die is a first test point and wherein the land provided on the surface of the testing paddle is electrically coupled to a second test point associated with the second DUT die. In an example, the test point is a die bond pad. In an example, a material of the testing paddle is selected from a group, comprising a printed circuit board (PCB) and a substrate. In an example, the semiconductor package further comprises a passive electronic component electrically coupled to the testing paddle. In an example, the passive electronic component is a termination resistor. In an example, the land is electrically coupled to the test point using a bond wire.

A semiconductor package is also described. In an example, the semiconductor package includes a carrier board; a semiconductor die mounted on and electrically coupled to the carrier board; and a testing paddle comprising at least one land, the at least one land electrically coupled to the semiconductor die. In an example, the carrier board comprises a measurement point adapted to receive at least a portion of a first probe and the at least one land is adapted to concurrently receive a second probe. In an example, the semiconductor die comprises at least one device under test (DUT) die. In an example, the at least one DUT die comprises a test point associated with a first spacing characteristic and electrically coupled to the at least one land, and wherein the at least one land is associated with a second spacing characteristic that is greater than the first spacing characteristic. In an example, the testing paddle is selected from a group, comprising a printed circuit board (PCB) and a substrate. In an example, the semiconductor package also includes a passive electronic component electrically coupled to the testing paddle.

Examples also describe a semiconductor package that may be used for device characterization, the semiconductor package comprising: a device under test (DUT) die; a testing means associated with the DUT die, the testing means electrically coupled to a communication means of the semiconductor package and associated with a first spacing characteristic; and a testing surface means coupled to the DUT die, the testing surface means comprising a connection means electrically coupled to the testing means, the connection means having a second spacing characteristic that is greater than the first spacing characteristic. In an example, the first spacing characteristic is a first pitch between the testing means and another testing means associated with the DUT die and the second spacing characteristic is a second pitch between the connection means and another connection means of the testing surface means. In an example, the second spacing characteristic is based, at least in part, on one or more dimensions of the connection means. In an example, a material of the testing surface means is selected from a group, comprising a printed circuit board (PCB) and a substrate.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A semiconductor package, comprising:
a device under test (DUT) die;
a test point associated with the DUT die, the test point electrically coupled to a trace of the semiconductor package and associated with a first spacing characteristic;
a testing paddle provided on a top surface of the DUT die; and
a land provided on a surface of the testing paddle, wherein the land:
is electrically coupled to the test point;
has a set of dimensions that is larger than a set of dimensions of the test point; and
is associated with a second spacing characteristic that is larger than the first spacing characteristic.

2. The semiconductor package of claim 1, wherein the first spacing characteristic is a first pitch between the test point and another test point associated with the DUT die and the second spacing characteristic is a second pitch between the land and another land provided on the surface of the testing paddle.

3. The semiconductor package of claim 1, wherein the second spacing characteristic is based, at least in part, on one or more dimensions of the land.

4. The semiconductor package of claim 1, wherein the DUT die is a first DUT die and wherein the semiconductor package further comprises a second DUT die, wherein the testing paddle is provided between the first DUT die and the second DUT die.

5. The semiconductor package of claim 4, wherein the test point associated with the first DUT die is a first test point and wherein the land provided on the surface of the testing paddle is electrically coupled to a second test point associated with the second DUT die.

6. The semiconductor package of claim 1, wherein a material of the testing paddle is selected from a group, comprising a printed circuit board (PCB) and a substrate.

7. The semiconductor package of claim 1, further comprising a passive electronic component electrically coupled to the testing paddle.

8. The semiconductor package of claim 7, wherein the passive electronic component is a termination resistor.

9. The semiconductor package of claim 1, wherein the land is electrically coupled to the test point using a bond wire.

10. The semiconductor package of claim 1, wherein the land is electrically coupled to the test point using one or more microbumps.

11. The semiconductor package of claim 1, wherein the testing paddle comprises a plurality of lands including the land, and a first pitch between a first pair of the plurality of lands is different from a second pitch between a second pair of the plurality of lands.

12. A semiconductor package that may be used for device characterization, the semiconductor package comprising:
a device under test (DUT) die;
a testing means associated with the DUT die, the testing means electrically coupled to a communication means of the semiconductor package and associated with a first spacing characteristic; and
a testing surface means provided on the DUT die, the testing surface means comprising a connection means, wherein the connection means:
is electrically coupled to the testing means;
has a set of dimensions that is larger than a set of dimensions of the testing means; and
is associated with a second spacing characteristic that is greater than the first spacing characteristic.

13. The semiconductor package of claim 12, wherein the first spacing characteristic is a first pitch between the testing means and another testing means associated with the DUT die and the second spacing characteristic is a second pitch between the connection means and another connection means of the testing surface means.

14. The semiconductor package of claim 12, wherein the second spacing characteristic is based, at least in part, on one or more dimensions of the connection means.

15. The semiconductor package of claim 12, wherein a material of the testing surface means is selected from a group, comprising a printed circuit board (PCB) and a substrate.

16. A semiconductor package, comprising:
a device under test (DUT) die;
a test point provided on a surface of the DUT die;
a testing paddle provided on a top surface of the DUT die; and
a land provided on a surface of the testing paddle, wherein the land:
is electrically coupled to the test point; and
has a set of dimensions that is larger than a set of dimensions of the test point.

17. The semiconductor package of claim 16, wherein the test point is electrically coupled to a trace of the semiconductor package.

18. The semiconductor package of claim 16, wherein the DUT die is a first DUT die and wherein the semiconductor package further comprises a second DUT die, wherein the testing paddle is provided between the first DUT die and the second DUT die.

19. The semiconductor package of claim 16, wherein the land is electrically coupled to the test point using a bond wire.

20. The semiconductor package of claim 16, wherein a shape of the land is different from a shape of the test point.

* * * * *